(12) United States Patent
Nijpels et al.

(10) Patent No.: US 11,796,432 B2
(45) Date of Patent: Oct. 24, 2023

(54) METHOD OF AND APPARATUS FOR PREPARING SAMPLES FOR IMAGING OR DIFFRACTION EXPERIMENTS UNDER CRYOGENIC CONDITIONS

(71) Applicant: UNIVERSITEIT MAASTRICHT, Maastricht (NL)

(72) Inventors: Franciscus Johannes Theresia Nijpels, Veldwezelt (BE); Raimond Ravelli, Maastricht (NL); Jacobus Peter Johannes Peters, Amsterdam (NL); Iglesias Carmen Lopez, Maastricht (NL)

(73) Assignee: UNIVERSITEIT MAASTRICHT, Maastricht (NL)

( * ) Notice: Subject to any disclaimer, the term of this patent is extended or adjusted under 35 U.S.C. 154(b) by 0 days.

(21) Appl. No.: 16/312,806

(22) PCT Filed: Jun. 22, 2017

(86) PCT No.: PCT/EP2017/065466
§ 371 (c)(1),
(2) Date: Dec. 21, 2018

(87) PCT Pub. No.: WO2017/220750
PCT Pub. Date: Dec. 28, 2017

(65) Prior Publication Data
US 2019/0170625 A1 Jun. 6, 2019

(30) Foreign Application Priority Data
Jun. 22, 2016 (EP) .................... 16175829

(51) Int. Cl.
*G01N 1/42* (2006.01)
*G01N 1/28* (2006.01)
*H01J 37/20* (2006.01)

(52) U.S. Cl.
CPC ............. *G01N 1/42* (2013.01); *G01N 1/2813* (2013.01); *H01J 37/20* (2013.01); *F25D 2400/30* (2013.01); *H01J 2237/2001* (2013.01)

(58) Field of Classification Search
CPC .......... G01N 1/42; G01N 1/2813; G01N 1/28; G01N 1/31; H01J 37/20; H01J 37/26;
(Continued)

(56) References Cited

U.S. PATENT DOCUMENTS 2,680,371 A 6/1954 Donath
4,336,691 A * 6/1982 Burstein ............ A61B 18/0218
62/51.1
(Continued)

FOREIGN PATENT DOCUMENTS

CN 104517791 A 4/2015
CN 105914122 A 8/2016
(Continued)

OTHER PUBLICATIONS

Burstein N. L. et al., "Cryofixation of tissue surfaces by a propane jet for electron microscopy", Micron (1969), Pergamon, vol. 9, No. 4, Jan. 1, 1978, pp. 191-198.
(Continued)

*Primary Examiner* — Brian M King
(74) *Attorney, Agent, or Firm* — Steven M. Koehler; Westman, Champlin & Koehler, P.A.

(57) ABSTRACT

The invention relates to a method of and apparatus for preparing a sample for imaging or diffraction experiments under cryogenic conditions, comprising the steps of applying a sample to sample carrier, such as a film on a support, in particular a grid comprising such a film on a support, or removing residual medium, typically liquid, from an incubated sample on a film on a support, and vitrifying the
(Continued)

sample. The sample is vitrified by directing a jet of liquid coolant to the center of the film and onto the sample.

14 Claims, 4 Drawing Sheets

(58) Field of Classification Search
CPC ......... H01J 2237/2001; F25D 2400/30; A01N 1/0268; A01N 1/021
USPC .............................................................. 62/64
See application file for complete search history.

(56) References Cited

U.S. PATENT DOCUMENTS

| | | | | |
|---|---|---|---|---|
| 4,753,887 | A * | 6/1988 | Bellare | G01N 1/42 |
| | | | | 435/1.3 |
| 7,413,872 | B2 | 8/2008 | Frederik et al. | |
| 9,116,091 | B2 | 8/2015 | Remigy et al. | |
| 9,541,476 | B2 | 1/2017 | Pickard | |
| 9,702,795 | B2 | 7/2017 | Carragher et al. | |
| 9,865,428 | B2 * | 1/2018 | Remigy | H01J 37/20 |
| 2004/0157284 | A1 | 8/2004 | Frederik et al. | |
| 2008/0268164 | A1 * | 10/2008 | Thayer | C23C 16/042 |
| | | | | 427/446 |
| 2009/0126373 | A1 | 5/2009 | Burg | |
| 2010/0181495 | A1 | 7/2010 | Lihl et al. | |
| 2012/0255313 | A1 | 10/2012 | Katkov et al. | |
| 2014/0360286 | A1 | 12/2014 | Carragher et al. | |
| 2015/0090878 | A1 * | 4/2015 | Remigy | H01J 37/20 |
| | | | | 250/307 |
| 2015/0147778 | A1 * | 5/2015 | Pickard | G01N 1/44 |
| | | | | 435/40.5 |
| 2017/0350798 | A1 | 12/2017 | Carragher et al. | |
| 2018/0209881 | A1 * | 7/2018 | Arnold | G01N 1/42 |
| | | | | 436/43 |

FOREIGN PATENT DOCUMENTS

| | | | | |
|---|---|---|---|---|
| EP | 1489642 | A1 | 12/2004 | |
| EP | 2381236 | A1 | 10/2011 | |
| EP | 2853847 | A1 | 4/2015 | |
| EP | 3 018 467 | A1 * | 5/2016 | ............... G01N 1/31 |
| EP | 3018467 | A1 | 5/2016 | |
| EP | 3-018-467 | A1 * | 11/2016 | ............... G01N 1/31 |
| EP | 3179229 | A1 | 6/2017 | |
| JP | 2015068832 | B1 | 4/2015 | |
| WO | 02077612 | A1 | 10/2002 | |
| WO | 2013109406 | A1 | 7/2013 | |
| WO | 2013152239 | A1 | 10/2013 | |
| WO | 2017005297 | A1 | 1/2017 | |

OTHER PUBLICATIONS

John C. Gilkey et al., "Advances in Ultrarapid Freezing for the Preservation of Cellular Ultrastructure", Journal of Electron Microscopy Technique, Jan. 1, 1986, pp. 3-177.
R. Van Venetie, "Propane jet-freezing: a valid ultra-rapid freezing method for the preservation of temperature dependent lipid phases", Journal of Microscopy, vol. 123, Sep. 30, 1981, pp. 287-292.
Trachtenberg, S. "A Fast-Freezing Device with a Retractable Environmental Chamber, Suitable for Kinetic Cryo-Electron Microscopy Studies", Journal of Structural Biology, 1998, Academic Press, 123, pp. 44-55.
W. B. Bald., "The relative merits of various cooling methods", Journal of Microscopy, vol. 140, No. 1, Oct. 1, 1985, pp. 17-40.
"Particle-surface interaction in thin vitrified films for cry-electron microscopy", by M. Cyrklaff et al., Journal of Microscopy, vol. 175, No. 2, Aug. 1994 pp. 135-142.
International Search Report dated Aug. 18, 2017 for corresponding International Application No. PCT/EP2017/065466, filed Jun. 22, 2017.
Written Opinion of the International Searching Authority dated Aug. 18, 2017 for corresponding International Application No. PCT/EP2017/065466, filed Jun. 22, 2017.
S. Kasas, et al., "Vitrification of cryoelectron microscopy specimens revealed by high-speed photographic imaging", Journal of Microscopy, vol. 211, Pt Jul. 1, 2003, pp. 48-53, accepted Mar. 14, 2003.
Frederik et al. "Handbook of Cryo-Preparation Methods for Electron Microscopy", CRC Press Taylor & Francis Group, LLC, 2009.
Muller et al. "Freezing in a Propane Jet and Its Application in Freeze-Fracturing", Mikroskopie, 1980, pp. 129-140, vol. 36.
Final comments of Proprietor and Examiner prior to text intended for grant.
Office Action in corresponding Chinese Patent Application No. 201780051499.0 dated Feb. 7, 2021.
Office Action in corresponding Chinese Patent Application No. 201780051499.0 dated Jun. 7, 2022.

* cited by examiner

METHOD OF AND APPARATUS FOR PREPARING SAMPLES FOR IMAGING OR DIFFRACTION EXPERIMENTS UNDER CRYOGENIC CONDITIONS

CROSS-REFERENCE TO RELATED APPLICATION

The present application is a national stage of and claims priority of International patent application Serial No. PCT/EP2017/065466, filed Jun. 22, 2017, and published in English as WO 2017/220750.

BACKGROUND

The discussion below is merely provided for general background information and is not intended to be used as an aid in determining the scope of the claimed subject matter.

The invention relates to method of and apparatus for preparing samples, such as (single) particles, e.g. macromolecular compounds, e.g. proteins, viruses, cells, bacteria, nanoparticles, and crystals, for imaging, e.g. in a cryo-electron microscope (EM), or diffraction experiments, e.g. inspection by ionizing radiation, under cryogenic conditions, comprising the steps of: applying a sample to a sample carrier, such as a film on a support, in particular a so-called EM grid, or removing residual medium, typically liquid, from an incubated sample on the sample carrier, and vitrifying the sample.

The invention further relates to an apparatus for preparing samples for imaging or diffraction experiments under cryogenic conditions.

EP 2 381 236 A1 relates to an apparatus for preparing a cryogenic TEM specimen on a specimen carrier, the apparatus comprising a plunger, blotters, a container for holding a cryogenic liquid, the plunger moving the specimen carrier to an applicator position for applying a liquid, blotting the specimen carrier, and plunging the specimen carrier in the cryogenic liquid. The apparatus is characterized in that it shows a first acceptor for holding a first storage capsule equipped to store one or more specimen carriers, the plunger is equipped with a gripper for gripping the specimen carrier; a second acceptor for holding a second storage capsule at a cryogenic temperature to store one or more specimen carriers at a cryogenic temperature; and the apparatus is equipped to move the specimen carrier automatically from the first storage capsule via the applicator position and the blotting position to the second storage capsule.

S. Kasas et al. "Vitrification of cryoelectron microscopy specimens revealed by high-speed photographic imaging", Journal of Microscopy, Vol. 211, Pt 1 Jul. 2003, pp. 48-53, contains a detailed analysis of the mechanism of sample vitrification through plunge freezing of sample grids.

EP 3 018 467 relates to an apparatus for removing fluid from a microscopic sample comprises a humidity chamber configured to control the humidity therein, and a sample clamp disposed within the humidity chamber and configured to clamp a sample support, which is loaded, or adapted to be loaded, with a microscopic sample. The apparatus comprises suction means configured to create suction at least adjacent to the sample to thereby remove fluid therefrom.

EP 2 853 847 relates to a method of preparing a sample for study in a charged-particle microscope, comprising the following steps: providing a substantially plate-like sample holder having opposed first and second major surfaces substantially parallel to one another, comprising at least one aperture that connects said major surfaces and across which a membrane has been spanned upon said first major surface, which membrane comprises at least one perforation; spanning a film of aqueous liquid across said perforation, which liquid comprises at least one study specimen suspended therein; plunging the sample holder onto a bath of cryogen, whereby the sample holder is held with said first major surface pointing toward the cryogen and arranged substantially parallel to an exposed surface of the cryogen, further comprising the following step: applying a blast of cryogenic fluid to said film from a nozzle pointing toward said second major surface, immediately prior to the film making contact with said cryogen.

EP 1 489 642 A1 discloses a sample carrier made of copper and having a diameter of 3.05 mm. The middle portion comprises openings of 90×90 µm^2 and bars with a width of 35 µm. The middle portion is surrounded by an edge portion with a strengthening effect. The width of the edge portion is 0.225 mm. The edge portion has no openings, with the exception of the orientation mark. The thickness of the copper foil is uniform across the entire sample carrier, with a value of approximately 20 µm. A sample can be applied to the middle portion in a manner known per se, whereby the regions of the sample that are of interest during an analysis are located above an opening.

SUMMARY

It is an object of the present invention to provide an improved method of and apparatus for preparing samples, in particular naturally hydrated samples, for example prokaryotic or eukaryotic cells or a protein solution, for imaging or diffraction experiments under cryogenic conditions.

To this end, the apparatus vitrifies the sample by directing a jet of liquid coolant to the center of the film and onto the sample, preferably directly onto the sample, i.e. without encapsulating or fixating chemicals.

Thus, the sample is vitrified first in the center of the support and from there towards the edge of the support, reducing or excluding effects of features, such as reinforcement of the support, located on that edge. More specifically, the present method enables extreme cooling rates in the sample itself, e.g. cooling rates in excess of 50.000 K/s.

Suitable coolants include liquid ethane, ethane-propane, helium, and nitrogen. Coolants preferably have a temperature in a range from 4 to 150 K, preferably in a range from 4 to 120 K.

In an embodiment, the time between completion of the application of the sample to the film and jet vitrification is short, e.g. less than a second, preferably less than 100 ms (milliseconds), preferably less than 50 ms, preferably less than 20 ms, preferably less than 10 ms. In an example, upon completion of the application of the sample to the film, the sample is aligned with the jets and the jets are immediately activated when the sample reaches this position.

To suppress or prevent the formation of artifacts in the vitrified sample, in an embodiment, at least one jet of liquid coolant is simultaneously directed to each side of the support. It is preferred that the jets are synchronized to within 0.5 ms from each other.

In an embodiment, the velocity of the jets of coolant is in a range from 1 to 50 m/s, preferably in a range from 1 to 20 m/s, and/or the combined mass flow rate of the jets is in a range from 0.1 to 100 L/min.

In a further embodiment, after the sample has been vitrified, residues of the coolant are removed from the sample, e.g. by blowing the residues off the sample by means of a gas, such as nitrogen. It is preferred that the gas has a temperature in a range from 93 to 120 K, to prevent on the one hand the liquid coolant from freezing and prevent on the other hand the formation of crystalline ice in the sample.

In another embodiment, the sample, film, support and the gripper holding the support are advanced, after vitrification, into a coolant to cool the gripper and prevent heat from the gripper to undo vitrification.

In another embodiment, that can be implemented independent from the jet(s), the sample carrier is exposed to a plasma, before applying the sample to the sample carrier.

The plasma will (glow) discharge sample carrier rendering the component or components of the sample carrier hydrophilic, which in turn facilitates a substantially even application of the sample to the sample carrier. Instead of or in addition to (glow) discharge, the plasma cleans the sample carrier. It is preferred that the sample carrier is subjected to a plasma just prior to applying the sample to the sample carrier, e.g. less than 15 minutes, preferably less than 10 minutes before applying the sample to the sample carrier.

In another embodiment, that can be implemented independent from the jet(s), the sample is applied to, e.g. printed onto, the sample carrier by means of a capillary or a pin.

In a preferred example, the capillary has an inner diameter in a range from 0.1 to 200 µm, preferably in a range from 0.1 to 100 µm. In a refinement, a plunger is located within the capillary and arranged to displace, e.g. by linear movement within the capillary, a tiny droplet, having a volume in a range from 1 to 100 pL towards the sample carrier. In another embodiment, a droplet is adhered to the pin.

When the capillary or pin approaches the hydrophilic sample carrier and the droplet touches the sample carrier, the droplet can be spread to create a thin layer, e.g. by moving the capillary or pin along the sample carrier (or vice versa) in a systematic pattern, such as parallel straight lines, concentric circles, or a spiral, e.g. until the capillary or the droplet is exhausted. Alternatively, several droplets can be applied on different locations on the sample carrier.

In an embodiment, a reservoir, e.g. a pipette, is provided to supply the pin of capillary with sample. E.g., a droplet or meniscus is temporarily expelled from the reservoir, sample is taken from the drop or meniscus by means of the pin or capillary, once or repeatedly until sufficient sample has been applied to the sample carrier or carriers, and the droplet or meniscus is withdrawn into the reservoir. The reservoir containing the sample can be stored for future use.

In another embodiment, a high DC voltage difference is applied between the capillary or pin on the one hand and the sample carrier on the other, creating an electrospray of the sample towards the sample carrier.

In an embodiment, the sample is in a capillary that is made of metal or metal coated polymer or glass or at least comprises an electrode, wherein the metal or electrode is connected to a high DC voltage, preferably having a voltage in a range from 1 to 5 kV. In a refinement, a metal ring is mounted a few millimeters away from the outlet opening of the capillary and connected to a ground or lower DC voltage. The ring accelerates the liquid out of the capillary, forming a spray of very tiny droplets, much smaller than droplets achieved with e.g. 'inkjet' technology. These droplets hit the glow-discharged hydrophilic film and form a thin layer.

In another embodiment, that can be implemented independent from the elements presented above, such as the jet(s), at least prior to and preferably also during and after application of the sample to the sample carrier, the temperature of the sample carrier is adjusted to a temperature around, at or above the dew point of the gas surrounding the sample carrier, preferably to one or more tenths of a degree, e.g. in a range from 0.1 to 1.0 degrees, below or above the dew point temperature of the gas surrounding the sample carrier. In an example, the dew point temperature is calculated from temperature and humidity measurements of the gas surrounding the sample carrier. The temperature of the sample carrier is measured as well. These three measurements are used in a closed feedback loop to control e.g. a Peltier element that thermally contacts the sample carrier. Thus, exchange of water, in particular evaporation, between the sample and the surrounding gas is suppressed or, ideally, prevented and reproducibility is enhanced.

In a further embodiment, one or more of the above steps, preferably all steps are carried out in a closed chamber, preferably providing controlled temperature and humidity.

The invention also relates to an apparatus for preparing samples for imaging or diffraction experiments under cryogenic conditions, comprising a holder for a sample carrier, e.g. a support carrying a film, an applicator for applying a sample to the sample carrier in the holder or a mechanism for removing residual medium from an incubated sample on the sample carrier, and characterized by a nozzle for directing a jet of liquid coolant to the center of the film and onto the sample, preferably directly onto the sample.

In an embodiment, at least one nozzle is located on each side of the support. In a further embodiment, the holder is movable between at least two positions, a first position at the applicator or the mechanism for removing residual medium and a further position in front of the nozzle(s).

Another embodiment comprises an inner vessel located beneath the nozzles, and preferably beneath the holder for the support, and an outer vessel surrounding the inner vessel and wherein the nozzles are located at the discharge end of pipes that extend with their feed ends into the outer vessel. When the outer vessel is pressurized, e.g. by means of gas pressure above the liquid surface in the outer vessel and in a range from 0.5 to 5 bar, preferably in a range from 1 to 4 bar, the liquid is pressed out through the pipes and nozzles at least substantially simultaneously. Also, the expelled coolant will be collected in the inner vessel. After vitrifying the sample on the support, the support can be lowered to yet a further position, preferably into the inner vessel, for temporary storage. Finally, the support can be transferred and stored in another vessel with liquid nitrogen.

In an embodiment, the apparatus comprises a further nozzle to remove, after the sample has been vitrified in a coolant, residues of the coolant from the sample with a gas.

In another embodiment, that can be implemented independent from the jet(s), the apparatus comprises an electrode, e.g. a plate or disc, on either side of the holder and, when it is placed in the holder, the sample carrier.

As explained above, the electrodes can be used to generate a plasma to discharge and/or clean sample carrier, e.g. the support and film. Also, if sample preparation is carried out in a closed chamber e.g. used to form a vacuum in a range from 0.1 to 1 mbar, the plasma can be employed to decontaminate the chamber, e.g. to sterilize the chamber after sample preparation. This is advantageous especially when processing bioactive samples, such as viruses and bacteria.

In an embodiment, the electrodes are coupled to a voltage source that generates a voltage between the electrodes in a range from 1 to 5 Volt DC.

In another embodiment, that can be implemented independent from the elements presented above, such as the jet(s), the applicator comprises a capillary or a pin for applying the sample to the sample carrier.

The applicator and pin have been discussed above. If the apparatus comprises a combination of the above-mentioned electrodes and a capillary or a pin, one or both of the electrodes can be used to generate a plasma and subsequently to apply a high DC voltage difference between the capillary on the one hand and the support on the other to create a spray of the sample from the capillary towards the sample carrier.

In an embodiment, the holder, and thus a sample carrier in it, and the capillary or pin are movable relative to each other, preferably in a systematic pattern, to apply a film or spots of the sample to the sample carrier.

In a further embodiment, that can be implemented independent from the elements presented above, such as the jet(s), the apparatus comprises a cooling and/or heating element, e.g. a Peltier element, for the sample carrier, a temperature sensor and a humidity sensor, and a controller arranged to calculate the dew point of the gas surrounding the sample carrier and to adjust, by means of the element, the temperature of the sample carrier to a temperature around, at or above the dew point of the gas surrounding the sample carrier.

In a refinement, the apparatus is configured to vitrify samples on a room temperature assembled autogrid. The autogrid is treated and handled during the entire process in an automated way. In a further refinement, one or more, preferably all of the moving parts are actuated and controlled by a microcontroller and a graphical user interface for the user. After loading the autogrids into the machine an automated process takes place.

Within the framework of the present invention, it is preferred that the sample be applied in a layer having a thickness less than 10 μm and, if the sample is prepared for a cryo-electron microscope, less than 200 nm. Suitable films on a support comprise normal EM grids, grids with cells, and so-named "autogrids" comprising a reinforcing ring. Preferred films include, but are not limited to, silicon nitride films and carbon and gold foils. The term "incubated sample" has its usual meaning, i.e. a sample maintained under conditions suitable for development, e.g. growth of the sample.

WO 2013/109405 relates to methods and compositions for preparation of complex specimen arrays for analysis by electron microscopy. These methods and compositions can permit high throughput screening of samples on single EM grid supports using sample volumes in the nanoliter and picoliter range.

WO 2013/109406 relates to methods and devices for preparing frozen vitrified samples for transmission electron microscopy. By reducing the volume of sample from microliter scale to picoliter scale, the requirement for blotting of excess fluid is minimized or eliminated.

US 2010/181495 relates to method and a device for preparing specimens for a cryo-electron microscope, wherein a carrier is fixed to a holder, sample liquid is applied to the carrier, and a blotting device for removing excess sample liquid from the carrier by means of the absorbing medium is applied.

WO 02/077612 relates to a device for preparing specimens for a cryo-electron microscope, comprising an environmental chamber, a holder for a sample or a carrier, and at least one blotting element to which a medium for absorbing liquid is or can be attached.

WO 2017/005297, published on 12 Jan. 2017, relates to a preparation system for preparing a sample for electron microscopy, comprising a liquid handling system, a support structure that is configured to accommodate the sample, and a temperature-controlled stage that is configured to keep said support structure at a pre-defined temperature when the support structure is arranged on the temperature-controlled stage, e.g. at a dew point temperature of the environment, with the possibility of establishing a small offset temperature to induce evaporation/condensation.

J. C. Gilkey et al., "Advances in Ultrarapid Freezing for the Preservation of Cellular Ultrastructure", Journal of Electron Microscopy Technique, 3:177-210 (1986) addresses, amongst other things, jet freezing of large and sturdy samples.

R. van Venetie, "Propane jet-freezing: a valid ultra-rapid freezing method for the preservation of temperature dependent lipid phases", Journal of microscopy, vol. 123, pages 287-292 (1981), relates to a temperature controlled specimen stage on a jet-freezing apparatus, wherein the specimen is placed between two silver plates.

N. L. Burstein et al., "Cryofixation of tissue surfaces by a propane jet for electron microscopy", Micron, vol. 9, pages 191-198 (1969), relates to the rapid freezing of tissues, e.g a cornea, by exposure to a high velocity jet of liquid propane at its freezing point.

WO 2013/152239 relates to a sample vitrification system, which includes a capsule structure configured for carrying a biological sample within a compartment while the sample is subjected to ultra-rapid freezing by way of a cryogenic coolant jet.

W. B. Bald, "The relative merits of various cooling methods", Journal of microscopy, vol. 140, pages 17-40 (1985), discusses three different methods of rapidly cooling specimens prior to microscopical analysis.

BRIEF DESCRIPTION OF THE DRAWINGS

The invention will now be explained in more detail with reference to the Figures, which show an embodiment of the present invention.

FIG. 1 shows an apparatus 1 for automated preparation of samples for imaging or diffraction experiments under cryogenic conditions. The apparatus comprises a movable holder 2 for a grid 3, a process chamber 4 for conditioning the grid and applying a sample to the grid and a jet vitrifyer 5.

Figure 1:
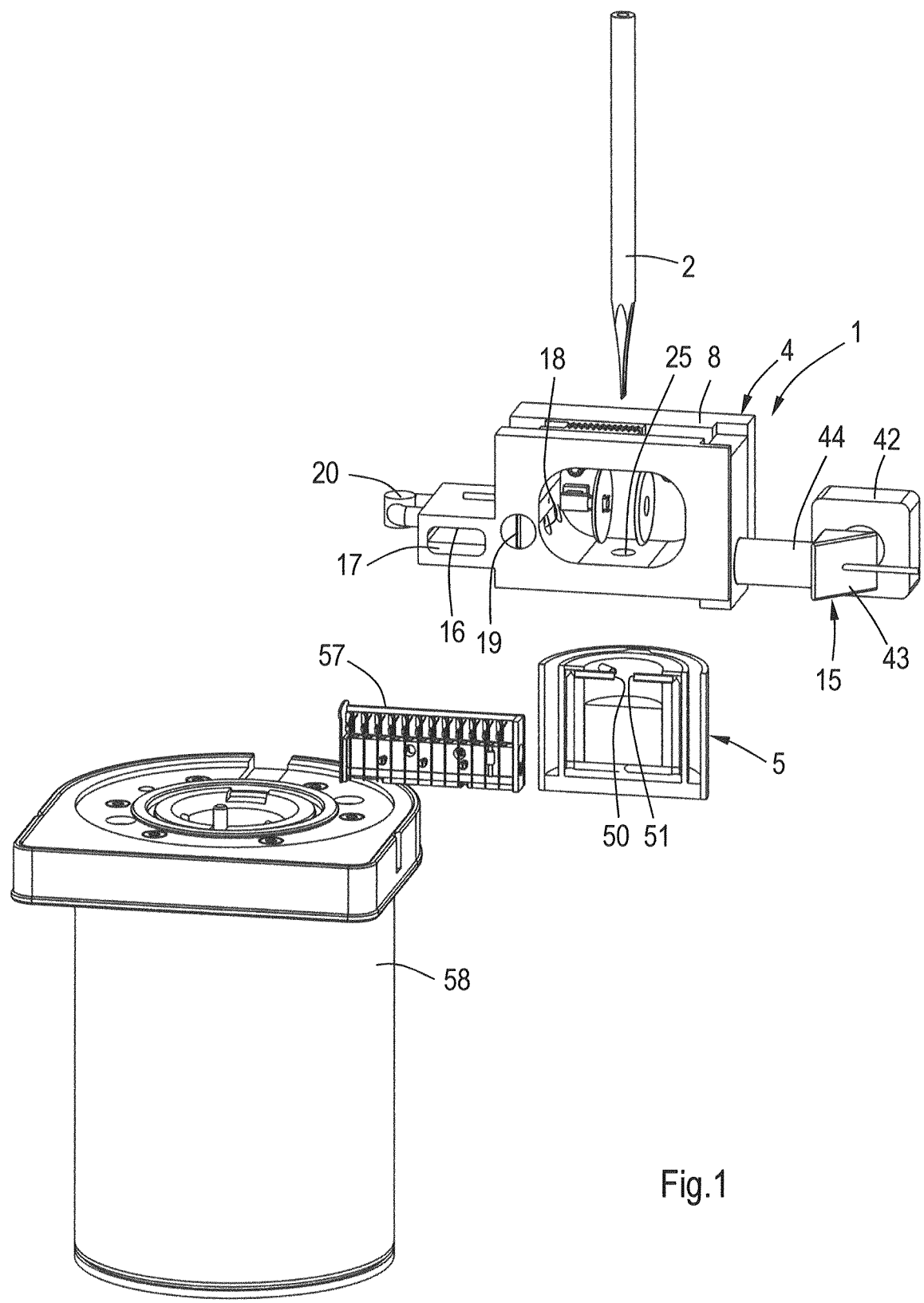
FIG. 1 is a perspective view of an apparatus for preparing samples for imaging or diffraction experiments under cryogenic conditions.

The holder 2 comprises a pair of arms 6, 7, similar to a tweezers, to releasably clamp a grid.

The process chamber 4 comprises a housing 8 defining a hermetically closable main chamber 9 and provided in the top wall with an opening (hidden from view) to allow the holder 2 and the grid 3 to enter and with a slidable tray 10 containing a supply of grids 3 and also functioning as a hermetic closure for the top opening. One of the sides of the housing is provided with a slidable applicator 15 for a sample, which applicator will be discussed in more detail below. Another side of the housing is provided with a further chamber 16 containing a humidifying solution 17, such as a saturated solution of NaCl in water resulting in 75% relative humidity of the air in the humidifying chamber, and communicating with the main chamber 9 via one or more conduits 18 provided with a valve 19. The humidifier chamber is provided with a pump 20 to circulate, in a controlled manner and when the valve 19 is open, humidified gas, typically air, between this chamber and the main chamber 9.

In this example, the bottom wall of the housing 8 is provided with a further opening 25 that is aligned with the opening in the top wall of the chamber 9 and with a slide (hidden from view) having an opening corresponding in size and shape to the bottom opening 25. The slide is movable between a first positon wherein the bottom opening and the opening in the slide are aligned, such that the holder 2 and the grid 3 can be lowered from the chamber 9 into the jet vitrifyer 5 beneath, and a second position wherein the slide hermetically closes the bottom opening.

Figure 2:
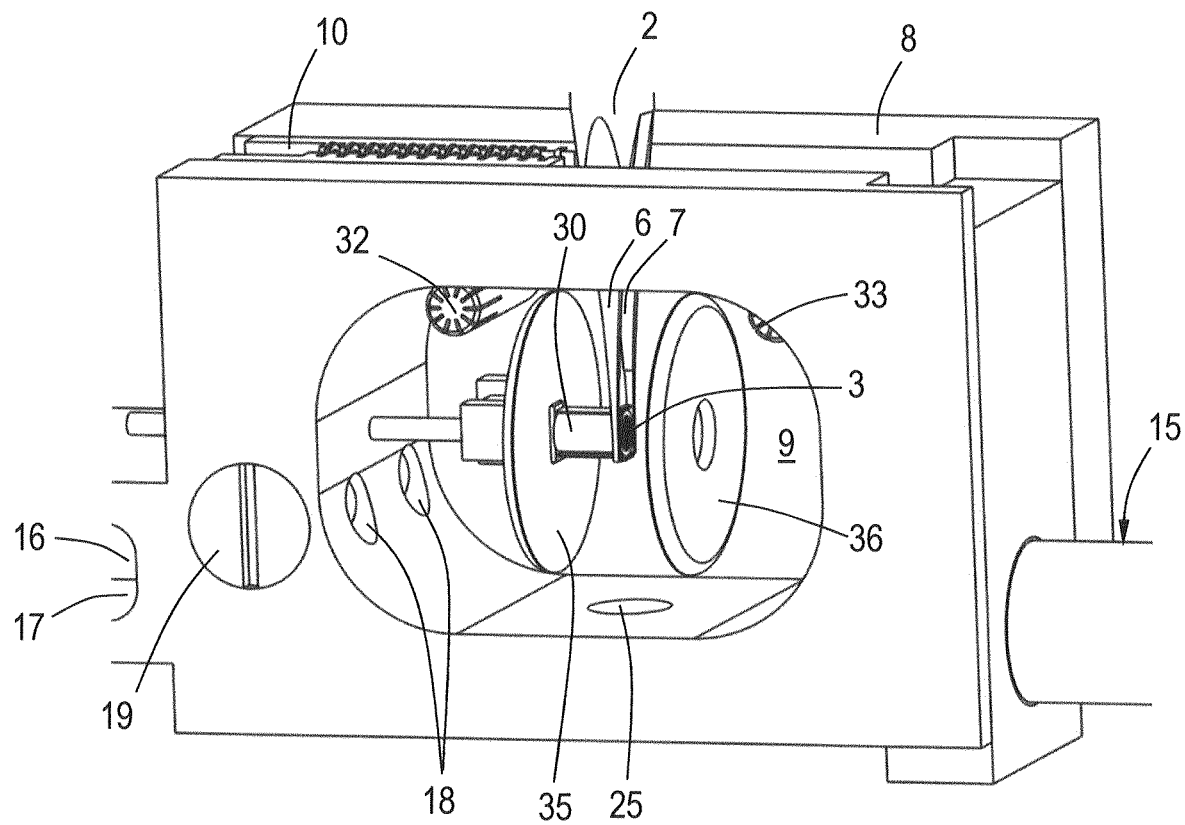
FIG. 2 is a perspective view of a process chamber in the apparatus shown in FIG. 1.

The main chamber is further provided with a Peltier element 30 (FIGS. 2 and 3) that is provided with a thermocouple and that is aligned with the applicator 15. The grid can be urged against the Peltier element by means of the movable holder or it can be placed in a further and stationary holder 31 extending about the Peltier element. A temperature sensor 32 and a humidity sensor 33 are provided in the main chamber 9 to measure temperature and humidity of the gas inside.

The main chamber 9 contains two electrodes, e.g. in the shape of a disc, a first electrode 35 mounted around the Peltier element and a second electrode 36 mounted inside the chamber 9 in register with and facing the first electrode. Both electrodes 35, 36 have a central opening, the first electrode to fit about the Peltier element 30 and the second electrode to enable the sample applicator 15 or at least the sample to pass.

The applicator 15 comprises a capillary 40 (FIG. 3) or a pin 41 (FIG. 4) for applying the sample to the grid 3. The applicator 15 is also provided with an on-axis visualization system (FIG. 1) comprising a camera 42, a mirror 43, and an objective 44. The capillary or pin extends through the mirror and the centre of the objective.

The jet vitrifyer comprises a pair of opposing nozzles 50, 51 and an inner vessel 52 located beneath the nozzles and an outer vessel 53 surrounding the inner vessel. The nozzles are formed by the discharge ends of pipes 54, 55 that extend with their feed ends into the outer vessel. In this example, the apparatus comprises a further nozzle 56 to remove, after the sample has been vitrified in a coolant, residues of the coolant from the sample with a gas.

FIG. 1 also shows a cassette 57 for storing vitrified samples and a Dewar 58 for storage and transport to e.g. an electron microscope.

During operation, a tray containing a plurality of autogrids is positioned on top of the process chamber 4, a first grid is clamped in the holder 2, lowered through the top opening into the main chamber 9 and clamped in the further holder 31 against the Peltier element 30. The top opening is closed, the main chamber 9 is evacuated to achieve a vacuum in a range from 0.1 to 1 mbar, and the valve 19 between the main chamber and the humidifying chamber is opened. The temperature and humidity in the main chamber and the temperature of the grid are measured by means of the sensors 32, 33, and the thermocouple in the holder 31 and the dew point of the gas in the main chamber is calculated from these measurements. The Peltier element is controlled to set the temperature of the grid to a temperature one or more tenths of a degree above the dew point temperature.

Subsequently, a high voltage is applied over the electrodes 35, 36 to generate a plasma to discharge and/or clean at least the grid 3 (metal support plus carbon film) in the holder 31.

Next, the applicator 15 is moved to the operating position and the capillary 40 (FIG. 3) or pin 41 (FIG. 4) is extended into the main chamber.

Figure 3:
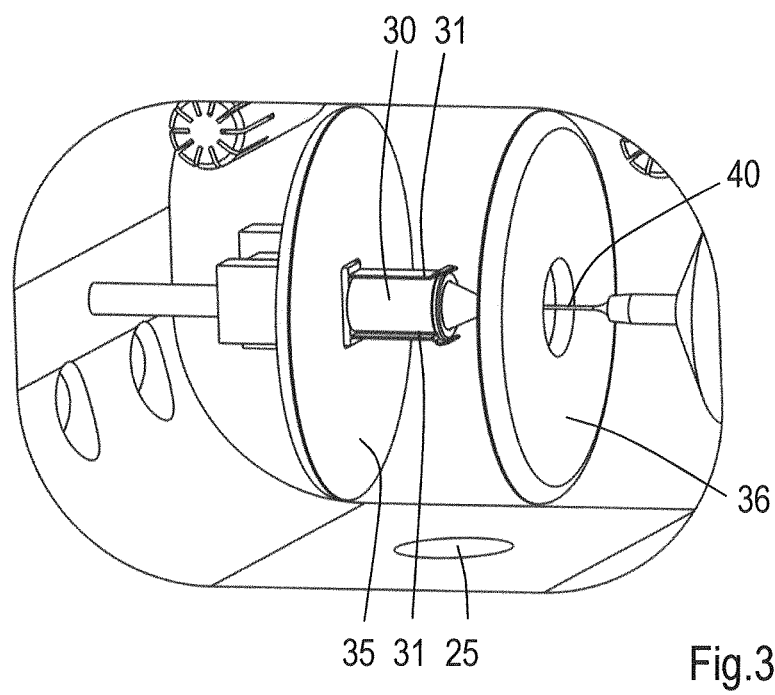
FIG. 3 is a perspective view of a first embodiment of an applicator for a sample.

In a first example, shown in FIG. 3, a high DC voltage difference is generated between the capillary 40 on the one hand and the grid 3 on the other to create a spray of the sample from the capillary towards the film, thus depositing a thin layer of the sample onto the grid. Deposition is monitored by means of the camera 42.

Figure 4:
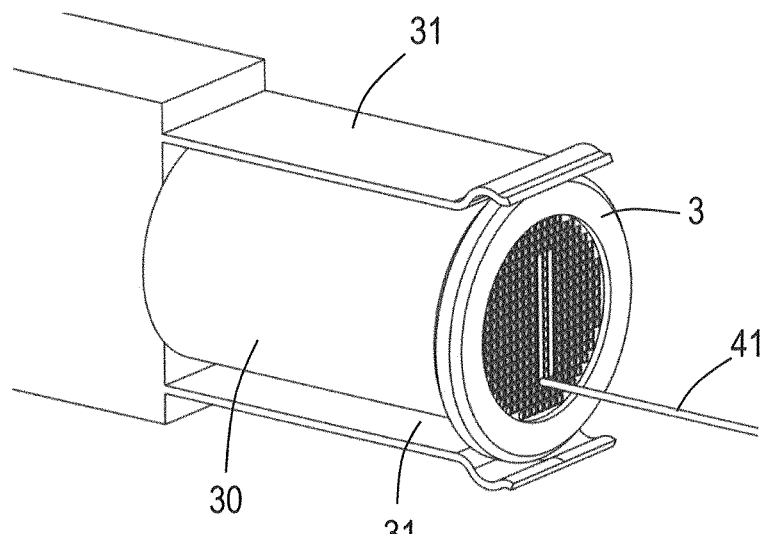
FIG. 4 is a perspective view of a second embodiment of an applicator for a sample.
Figure 5:
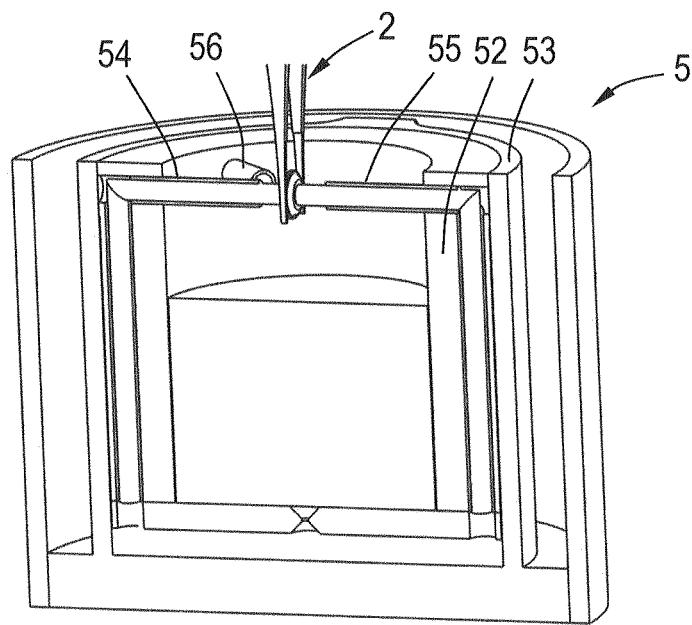
FIG. 5 is a perspective view of jet vitrifyer.

In a second example, shown in FIG. 4, an amount of sample is adhered to the tip of the pin 41 and the pin is advanced towards the grid 3 until the sample touches the grid. The pin is moved relative to the holder 31 and the grid 3 in a systematic pattern, to apply a thin layer of the sample to the grid. This 'printing' process is monitored by means of the camera 42.

Immediately after the sample has been applied to the grid, the top opening in the process chamber 4 is cleared and the grid is transferred to the movable holder 2. The bottom opening is cleared, the grid is lowered into the jet vitrifyer 5 between the nozzles 50, 51, and liquid ethane is jetted from the nozzles 50, 51 to vitrify the sample in less than 5 ms, e.g. in 2 ms. In the next 200 to 300 ms, the rest of the grid is cooled as well. The grid carrying the sample is lowered into the inner vessel 52 for cooling the holder 2 and for temporary storage in the liquid nitrogen.

Figure 6:
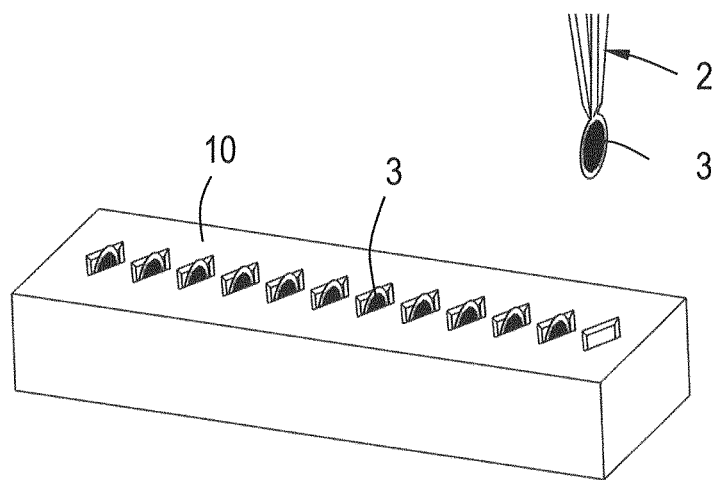
FIG. 6 is a perspective view of supply box containing standard grids.
Figure 7:
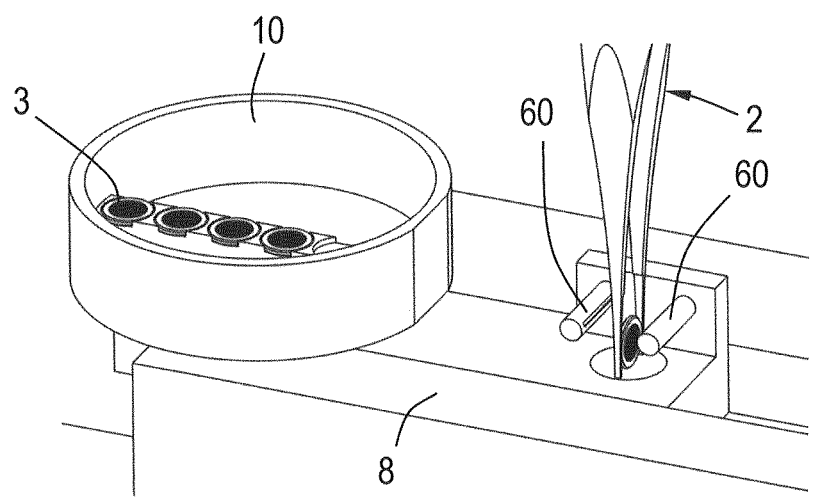
FIG. 7 is a perspective view of a mechanism for removing residual medium from an incubated sample.

The invention is not restricted to the above-described embodiments, which can be varied in a number of ways within the scope of the claims. For instance, instead of grids comprising a reinforcing ring, the apparatus can also be used in conjunction with standard EM grids, as shown in FIG. 6. Also, instead of transferring the grid from a movable holder to a further stationary holder (31) in the process chamber, the grid can remain in the movable holder (2) and be moved from one station to the next by that holder. In that case, it is preferred that the holder provides a close fit inside at least the top opening in the chamber to maintain conditions inside the chamber. As a further example or add-on, shown in FIG. 7, the apparatus can comprise a mechanism, such as air blades 60, for removing residual medium, typically liquid, from an incubated sample on a support.

The invention claimed is:

1. A method of preparing a sample for imaging under cryogenic conditions or diffraction experiments under cryogenic conditions, comprising:
   applying a sample to a sample carrier, wherein the sample carrier includes a first side upon which the sample is supported and a second side facing in a direction opposite to the first side, and
   vitrifying the sample by directing jets of coolant to a center of the sample carrier and onto the sample carrier, thus vitrifying the sample first in the center of the sample and from there a remainder of the sample extending towards an outer perimeter of the sample carrier, the center of the sample carrier being spaced apart and inwardly from the outer perimeter of the sample carrier, wherein directing the jets of liquid coolant towards the center of the sample carrier and onto the sample comprises directing a first jet of liquid coolant to the first side and directing a second jet of liquid coolant to the second side of the sample carrier of the sample carrier.

2. The method according to claim 1, wherein the time between completion of applying the sample to the sample carrier and vitrifying the sample is less than a second.

3. The method according to claim 1, wherein the first jet of liquid coolant that is directed to the first side of the sample carrier and the second jet of liquid coolant that is directed to the second side of the sample carrier are synchronized to be within 0.5 ms from each other.

4. The method according to claim 1, wherein a velocity of the jets of liquid coolant is in a range from 1 to 50 m/s.

5. The method according to claim 1, wherein, after the sample has been vitrified, residues of the coolant are removed from the sample.

6. The method according to claim 1, wherein the sample, sample carrier and a gripper holding the sample carrier are advanced, after vitrification of the entire sample, into a coolant to cool the gripper and prevent heat from the gripper to undo vitrification.

7. The method according to claim 1, wherein, before applying the sample, the sample carrier is exposed to a plasma.

8. The method according to claim 1, wherein prior to application of the sample to the sample carrier, a temperature of the sample carrier is adjusted to a temperature at or above a dew point of the gas surrounding the sample carrier.

9. The method according to claim 1, wherein one or more of the steps are carried out in a closed chamber.

10. The method of claim 1 and further comprising removing residual medium from the sample, which has been incubated.

11. The method of claim 1 wherein the sample comprises a film and the sample carrier comprises a grid.

12. The method of claim 1 wherein a velocity of the jets of liquid coolant is in a range from 1 to 20 m/s.

13. The method of claim 1 wherein a combined mass flow rate of the jets of liquid coolant is in a range from 0.1 to 100 L/min.

14. The method according to claim 1, wherein all steps are carried out in a closed chamber.

* * * * *